United States Patent
Vasishta et al.

(10) Patent No.: US 7,825,689 B1
(45) Date of Patent: Nov. 2, 2010

(54) FUNCTIONAL-INPUT SEQUENTIAL CIRCUIT

(75) Inventors: Mahesh Ramdas Vasishta, Bangalore (IN); Pavan Vithal Torvi, Bangalore (IN); Sonal Rattnam Sarthi, Bangalore (IN); Badarish Mohan Subbannavar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/541,873

(22) Filed: Aug. 14, 2009

(51) Int. Cl.
H03K 19/173 (2006.01)
(52) U.S. Cl. .............................. 326/46; 326/119; 326/56
(58) Field of Classification Search ............ 326/56–58, 326/83–87, 93–98, 112, 119, 121, 46
See application file for complete search history.

(56) References Cited

U.S. PATENT DOCUMENTS

| 6,522,171 | B2 * | 2/2003 | Hanson et al. ................. 326/95 |
| 2002/0089352 | A1 * | 7/2002 | Hanson et al. ................. 326/95 |
| 2005/0093577 | A1 * | 5/2005 | Nguyen et al. ............... 326/105 |
| 2009/0085629 | A1 * | 4/2009 | Harris et al. ................. 327/218 |
| 2010/0061161 | A1 * | 3/2010 | Jung et al. ............. 365/189.08 |

\* cited by examiner

*Primary Examiner*—Don P Le
(74) *Attorney, Agent, or Firm*—Dawn V. Stephens; Wade James Brady, III; Frederick J. Telecky, Jr.

(57) ABSTRACT

An exemplary functional input sequential circuit for reducing the setup time of input signals. The functional sequential circuit includes a tri-state inverter having an input signal and two control signals. The transmission circuit receives a control signal from a combinational logic circuit that performs a logical operation on a second input signal and a clock signal. The output of the transmission circuit is coupled to a digital storage element. Further, a control circuit is coupled to the digital storage element in order to force a value on the digital storage element when no input signal is received from the transmission circuit. The control circuit is also controlled by the second input signal and a clock signal.

20 Claims, 6 Drawing Sheets

FUNCTIONAL-INPUT SEQUENTIAL CIRCUIT

TECHNICAL FIELD

Embodiments of the disclosure relate to sequential circuits, and more specifically, to high-performance functional-input sequential circuits.

BACKGROUND

Some sequential circuits, such as latches and flip-flops, accept an input that is a logical function of multiple inputs; these sequential circuits are typically called functional-input sequential circuits. The logical function of the input signals can be any function such as an OR, NAND, NOR, or AND operation. Typically, implementation of these logical functions requires a series combination of transistors, which increases the input signals setup time, defined as the minimum amount of time before a clock's active edge by which the data must be stable for it to be latched correctly. Any violation in this minimum required time causes incorrect data capture, known as setup violation.

Further, in networks that include a number of sequential elements in a single clock path, the sequential elements face different insertion delays, and therefore, the clock signal reaches the sequential elements at different times. If the setup time of the signals at the sequential elements is different and further, if the sequential elements have varying insertion delays, data can be incorrectly captured, causing errors. In certain situations, the clock can be skewed to compensate for the insertion delays, but if the sequential elements all belong to the same clock path, skewing the clock becomes cumbersome.

BRIEF SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Embodiments of the invention are directed to an exemplary functional-input sequential circuit. The functional-input sequential circuit includes a transmission circuit receiving a first input signal, a first control signal, and a second control signal. The circuit further includes a combinational logic circuit receiving a second input signal and a clock input signal, the combinational logic circuit is operatively coupled to the transmission circuit providing the first control signal to the transmission circuit. The second control signal is derived from the clock or from the first control signal using some combinational logic. The transmission circuit further provides an output to a digital storage element. In addition, a control circuit is coupled to the digital storage element to force a value on the digital storage element depending on a state of the first and second input signals and the clock signal.

DETAILED DESCRIPTION

Overview

The following detailed description is made with reference to the figures. Preferred embodiments are described to illustrate the present invention, not to limit its scope, which is defined by the claims. Those of ordinary skill in the art will recognize a variety of equivalent variations of the description that follows.

Figure 1:
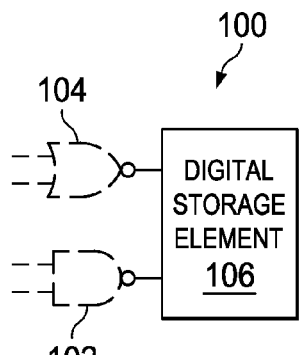
FIG. 1 is a block diagram of a conventional functional-input sequential circuit.
Figure 2:
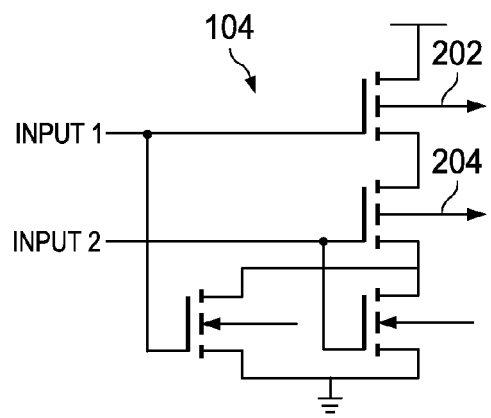
FIG. 2 is a circuit diagram of a conventional NOR gate.

Typically, in functional-input sequential circuits a logic gate performing a logical function on at least two input signals provides the input to a sequential device. The logical function can be a NAND, NOR, AND, or OR function. FIG. 1 illustrates a typical functional-input sequential circuit 100, as employed in the art, that includes a dual input NAND gate 102 or NOR gate 104 coupled to the input of a digital storage element 106, such as a latch or a flip-flop. In order to realize the dual input logical function of the NAND gate 102 or the NOR gate 104, two or more cascaded stages of transistor circuitry is required. FIG. 2 depicts the NOR gate 104 implemented using CMOS transistors, which includes four transistors connected in series and parallel, as also found in the art. Due to the series stacking of the PMOS transistors 202 and 204, the setup time of any input signal increases, which degrades the performance of the typical functional input sequential circuit 100. Hence, removing the series stack of transistors can reduce the setup time, thereby increasing the performance of the typical functional input sequential circuit 100.

To this end, embodiments of the present invention replace a multiple input logical gate present at the input of a digital storage element with a single-input transmission circuit and a combinational circuit that controls the gating of the single-input transmission circuit. One of the multiple input signals is provided to the single-input transmission circuit, while the other input signals are provided to the combinational logic circuit. In one implementation, the input signals include a critical and one or more non-critical signals. Examples of critical signals are enable signals, data signals, and so on. Examples of non-critical signals can be reset signals, set signals, scan signals, test signals, and so on. The non-critical signals are removed and placed in the combinational logic circuit, while the critical signal is provided directly to the transmission circuit. Typically, the non-critical signals are not used as often as the critical signals; therefore, removing the non-critical signals from the critical path ensures considerable reduction in the setup time of the critical signal.

In another implementation, all the input signals are critical, in which case, one signal is supplied to the single-input transmission circuit, while the other signals are supplied to the combinational logic circuit. In this case, the signal provided to the single-input transmission circuit has a shorter setup time compared to the input signal provided to the combinational logic circuit. It will be understood that the new topology performs the same functionality as a multiple input functional sequential circuit. These and other designs, features, and advantages of the present invention will become apparent with reference to the following detailed description and the drawings.

Embodiments

Figure 3:
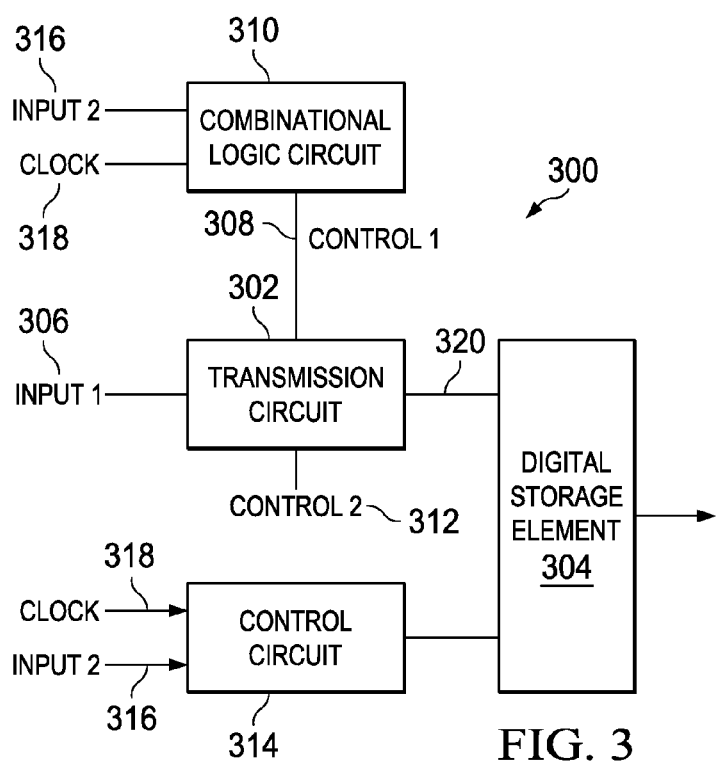
FIG. 3 is a block diagram of an exemplary functional-input sequential circuit.

FIG. 3 illustrates a block diagram of an exemplary functional-input sequential circuit 300 according to an embodiment of the claimed invention. The functional-input sequential circuit 300 includes a transmission circuit 302 coupled to a digital storage element 304, the transmission circuit 302 receives a first input signal 306, and a first and second control signals. A combinational logic circuit 310 provides the first control signal 308, while the second control signal 312 can be an inverted clock signal, an inverted first control signal, a clock signal, and so on. Further, a control circuit 314 controls a digital value of the digital storage element 304. A second input signal 316 and a clock signal 318 are provided as inputs to the combinational logic circuit 310 and the control circuit 314. The control circuit 314 forces a high or low value on the digital storage element 304 depending on the value of the second input signal 316, and the clock signal 318. Moreover, an output 320 of the transmission circuit 302 is provided to the digital storage element 304.

In one embodiment, the transmission circuit 302 is a tri-state inverter receiving an input signal and two control signals. The value of the control signals 308 and 312 determine the operation of the tri-state inverter, i.e., the control signals 308 and 312 can switch on/off the tri-state inverter. For example, when the control signal 308 is low and control signal 312 is high, the output 320 of the tri-state inverter is the inverted input signal. Alternately, when the control signal 308 is high and control signal 312 is low, the output 320 is disconnected from the rest of the circuit. Thus, the control signals can control the operation of the tri-state inverter. In another embodiment, the transmission circuit 302 is a simple inverter followed by a pair of transmission gates that provides the same functionality as the tri-state inverter. Other examples of the transmission circuit 302 include switches, tri-state buffers, and buffers. A suitable transmission circuit is selected based on the application of the functional-input sequential circuit 300; for example, in cases where the logical function is an AND or OR operation, the transmission circuit 302 can be a tri-state buffer or a buffer followed by a transmission gate.

As stated previously, the combinational logic circuit 310 provides at least one of the control signals, such as the control signal 308, to the transmission circuit 302. The combinational logic circuit 310 can perform a certain logical function on input signals based on the type of logic gates used. Further, the same logical function can be achieved by using different logic gates or by changing the order of the logic gates in the circuit. It will be understood that any combination of logic gates can be used to derive a particular logical function. For example, the combinational logic circuit 310 can realize logical functions such as AND, NAND, NOR, NOT, and so on.

In one implementation, the combinational logic circuit 310 receives a second input signal 316 and a clock signal 318, and the circuit outputs the control signal 308 based on a logical function of the input signals. Further, the control signal 308 controls gating of the transmission circuit 302.

The digital storage element 304 can be a latch or a flip-flop. The following two paragraphs explain the basic concepts related to digital storage elements. A latch is an electronic circuit that has two stable states and thereby stores one bit of information. The output of a latch may depend not only on its current input, but also on its previous inputs, and therefore latches are described as sequential logic circuits. Further, latches are designed to be transparent, i.e., a change in an input signal causes immediate changes in output. Alternatively, additional logic can be combined with a simple transparent latch to make it opaque when another input is not asserted. For example, a clock signal can control the state of the latch. When the clock signal is low, the latch behaves transparently and forwards the input signal to the output. Alternatively, when the clock signal is high, the latch behaves opaquely, and forwards the last input signal value that was stored in the latch.

A flip-flop, like a latch, stores one bit of information and is usually controlled by one or two control signals and/or a clock signal. The output often includes the output signal together with its complement. Unlike latches, flip-flops are not transparent, and they ignore their inputs except at the transition of a dedicated clock signal. Thus, a flip-flop can either change or retain its output signal based upon the values of the input signals at the clock transition. Some flip-flops change their outputs on the rising edge of the clock, others on the falling edge. A commonly used master-slave flip-flop can be made using two latches, one as master and other as slave latch.

The control circuit 314, coupled to the digital storage element 304, can operate as a pull-up or a pull-down circuit. The pull-up circuit forces a high (one) value on the digital storage element 304 when the tri-state inverter 402 is not driving the input of the digital storage element 304 or when the clock signal 318 is low. While, the pull-down circuit forces a low (zero) value on the digital storage element 304 when the tri-state inverter 402 is not driving its input and also when clock signal 318 is low, i.e., latch is transparent. For example, if the tri-state inverter 402 is disabled, the control circuit 314 can either pull-up or pull-down the value of the digital storage element 304 depending on the embodiment.

The combinational logic circuit 310 and the control circuit 314 aid in producing a value at the output of the digital storage element 304, which is a logical function of the first input signal 306, the second input signal 316, and the clock signal 318. Further, these circuits can replace any multiple-input logic function placed before the digital storage element 304. For example, these circuits along with the transmission circuit 302 can replace an OR, an AND, a NOR or a NAND gate. The following FIGS. 4-10 will describe some embodiments of the functional-input sequential circuit 300.

In one embodiment, the functional-input sequential circuit 300 is part of an integrated clock-gating cell (ICG). Usually, the ICG cells gate a clock signal thereby reducing the total power consumed in a circuit. These ICG cells typically include a NOR gate that receives an enable signal and a test signal. The NOR gate is coupled to a latch that receives the NOR gate output and a clock signal and the output of the latch is provided to an AND gate along with the clock signal. The output of the AND gate is a gated clock signal, which can be provided to the rest of the circuit. Most often, ICG cells are inserted after a clock distribution system and before the rest of the circuit. Placing one ICG cell for the entire circuit provides better power reduction and consumes lesser chip space, but on the other hand, affects the enable signal timing.

One embodiment of the present invention includes a high-performance ICG cell that reduces the setup time of the enable signal considerably. This result can be achieved by replacing the ICG's NOR gate with a faster gate. Since the NOR gate includes a series stack of transistors receiving multiple signals including critical and non-critical signals, the setup time of the critical signal or enable signal increases. Thus, replacing the NOR gate (with a logic gate receiving only the critical signal) can reduce the setup time of the enable signal. The two input signals to the NOR gate are the enable signal and the test signal, by removing the test signal from the critical path of the circuit and providing it to control the transmission circuit 302, the performance of the ICG cell is enhanced. Further, because the series transistor stack from the input stage is removed, the setup time for zero and one logic of the enable signal are more balanced. In addition, since the transmission circuit 302 receives only the enable signal as an input, it can be independently sized to reduce area and decrease the setup time.

Figure 4:
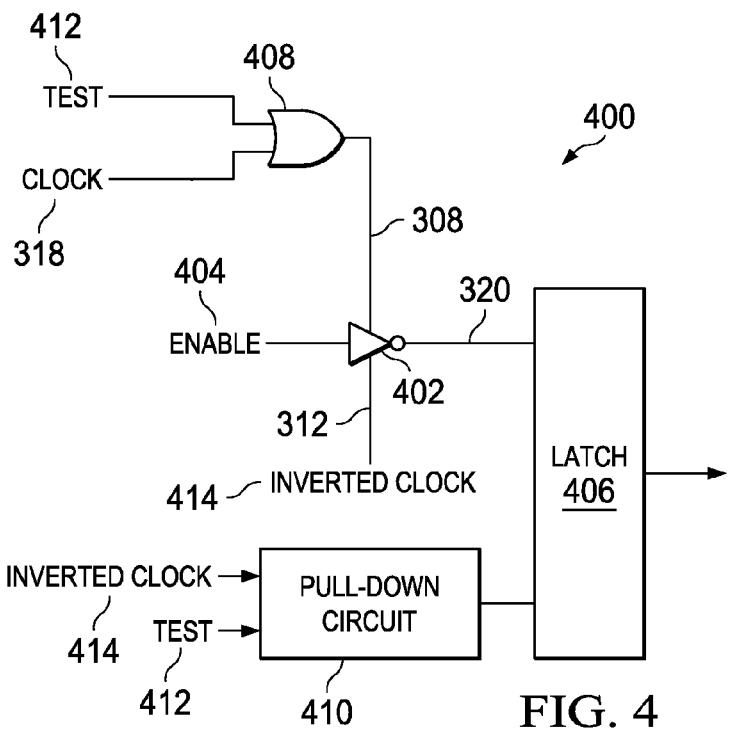
FIG. 4 is a block diagram of an exemplary NOR input latch.

FIG. 4 is a block diagram of an exemplary NOR input latch 400 that can be used to replace the NOR gate and the latch of the ICG. The exemplary NOR input latch 400 includes a tri-state inverter 402 receiving an enable signal 404, a latch 406 receiving the output signal 320 from the tri-state inverter 402, an OR combinational logic circuit 408, and a pull-down circuit 410. The OR combinational logic circuit 408 performs a logical OR operation on the clock signal 318 and a test signal 412 and provides the control signal 308 to the tri-state inverter 402, while the control signal 312 is derived from an inverted clock signal 414. The pull-down circuit 410 is coupled to the latch 406 and it controls the latch's value. When the latch 406 does not receive an input from the tri-state inverter 402 and when the clock signal 318 is low, the pull-down circuit 410 forces the value of the latch 406 to a logical zero. Further, the inverted clock signal 414 and the test signal 412 control the pull-down circuit 410.

The enable signal 404 is a functional signal that is used in the normal operation of the ICG, while the test signal 412 is typically used to test the ICG. It will be appreciated however, that the NOR input latch 400 can be utilized in any circuitry and its application is not restricted to the ICG, also any input signals can be applied to the NOR input latch 400, such as data signals, clear signals, reset signals, scan signals, and so on. The implementation of the NOR input latch in an ICG is merely an example to illustrate the operation of the NOR input latch 400.

Figure 5:
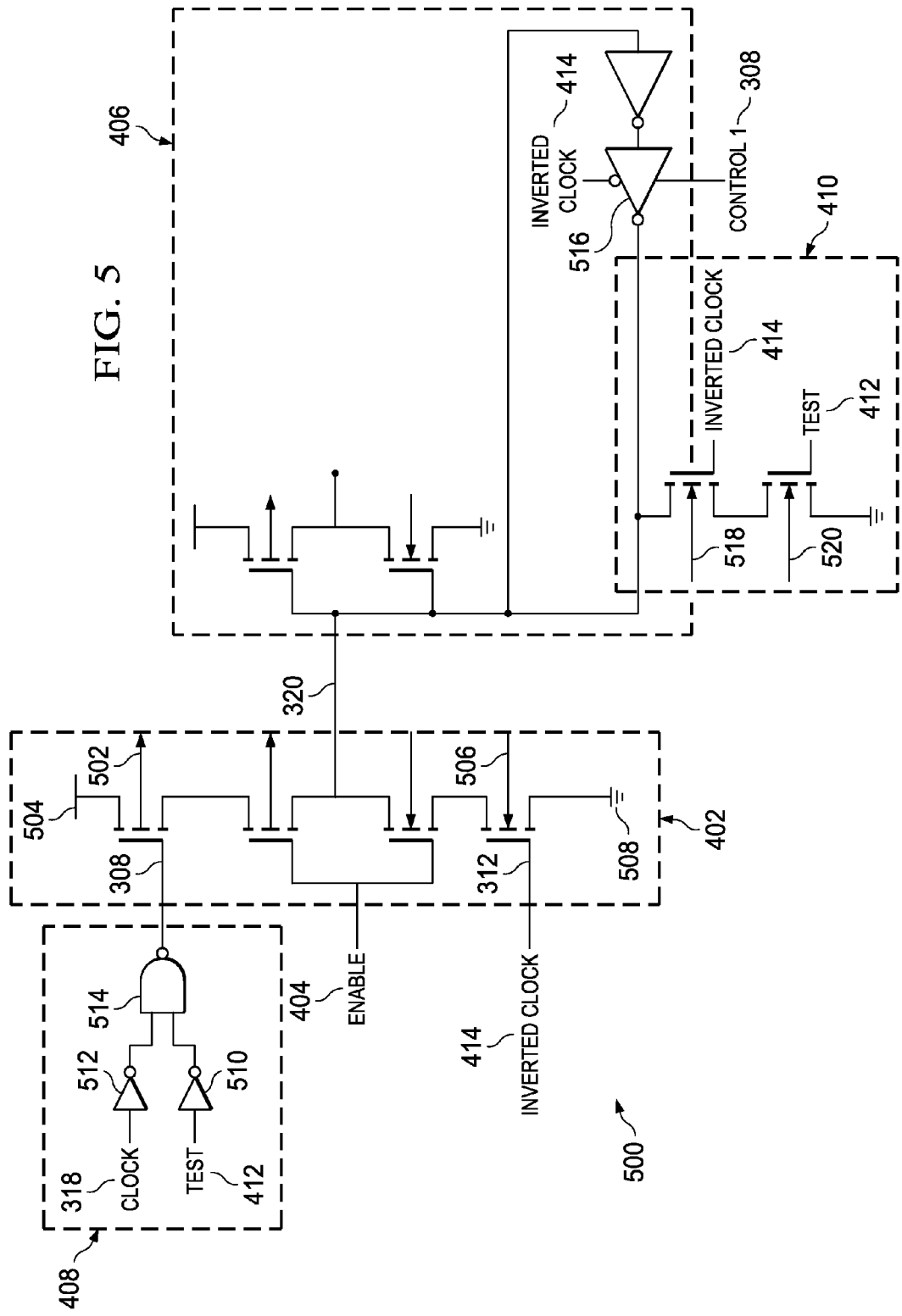
FIG. 5 is a circuit diagram of an exemplary NOR input latch.

FIG. 5 illustrates a circuit diagram 500 for the exemplary NOR input latch 400. Here, the tri-state inverter 402 comprises PMOS and NMOS transistors. The control signal 308 drives the PMOS transistor 502, which is connected between a power supply 504 and a second PMOS transistor, while the inverted clock signal 414 (the second control signal 312) drives the NMOS transistor 506, which is connected between the ground 508 and a second NMOS transistor. A logical one to the PMOS transistor 502 disconnects the circuit from the power supply 504, while a logical zero connects the tri-state inverter 402 to the power supply 504. Similarly, a logical one to the NMOS transistor 506 drives the enable signal 404 to the ground 508, while a logical zero disconnects the circuit from the ground 508.

As shown, the logical OR operation of the OR combinational logic circuit 408 can be realized by inverting the test signal 412 and the clock signal 318 at the inverters 510 and 512 respectively and providing the inverted signals to a NAND gate 514. The output of the NAND gate 514 is the control signal 308, which is provided to the PMOS transistor 502.

The latch 406 can be implemented using any configuration known in the art. For example, the latch depicted in FIG. 5 includes a tri-state inverter 516 in a feedback loop. The control signal 308 and the inverted clock signal 414 control the gating of the tri-state inverter 516. When the inverted clock signal 414 is low and the control signal is high, the latch 406 behaves opaquely and forwards the last stored value. Alternately, when the inverted clock signal 414 is high, the latch 406 is transparent, passing the signal at its input to the output.

Further, the pull-down circuit 410 is implemented using two NMOS transistors 518 and 520, controlled by the inverted clock signal 414 and the test signal 412 respectively. Since both the transistors are NMOS and in series, both the inverted clock signal 414 and the test signal 412, must be high in order to enable the pull-down circuit 410. Using the inverted clock signal 414 along with the test signal 412 ensures that the test signal 412 does not change the value of the latch 406 asynchronously.

The operation of the NOR input latch 400 will be described now with reference to the FIGS. 4 and 5. A typical NOR truth table for the enable and test signals is depicted in table 1, while table 2 depicts the operation of the exemplary NOR input latch 400.

TABLE 1

NOR truth table

| Test 412 | Enable 404 | Output 320 |
|---|---|---|
| 0 | 0 | 1 |
| 0 | 1 | 0 |
| 1 | 0 | 0 |
| 1 | 1 | 0 |

TABLE 2 operation of the exemplary NOR input latch

| Enable 404 | Test 412 | Clock 318 | Control 308 | Control 312 | Output 320 |
|---|---|---|---|---|---|
| 0 | 0 | 0 | 0 | 1 | 1 |
| 0 | 0 | 1 | 1 | 0 | unchanged |
| 0 | 1 | 0 | 1 | 1 | 0 (pull down) |
| 0 | 1 | 1 | 1 | 0 | Unchanged |
| 1 | 0 | 0 | 0 | 1 | 0 |
| 1 | 0 | 1 | 1 | 0 | Unchanged |
| 1 | 1 | 0 | 1 | 1 | 0 (pull down, both) |
| 1 | 1 | 1 | 1 | 0 | Unchanged |

Table 2 shows that the NOR function is obtained between the enable signal 404 the test signal 412, for high and low values of the clock signal 318. It should be noted that when the clock 318 is low, the latch 406 value is allowed to change and for a high clock value, the latch 406 value remains unchanged and the latch 406 drives the stored value (as seen in rows 2, 4, 6, and 8 of table 2).

As depicted in table 2, when both the test signal 412 and the clock signal 318 are zero (rows 1 and 5 of table 2), the output 320 follows a simple inversion of the enable signal 404. Therefore, when the test signal 412 is zero and the clock signal 318 is low, the tri-state inverter 402 inverts the enable signal 404 and the output 320 is provided to the latch 406.

When the test signal 412 is one and the clock signal 318 is zero (rows 3 and 7 of table 2), the control signals 308 and 312 are one, which keeps PMOS 502 off and turn NMOS 506 on respectively. If the enable signal 404 is one, the output 320 of the tri-state inverter 402 is pulled down to zero as NMOS 506 is also on. However, here the pull-down circuit 410 is also enabled (as the test signal 412 and the inverted clock signal 414 are high), which also pulls the output 320 down (row 7)

and the latch 406 accepts the new value. If the enable signal is zero, the tri-state inverter 402 is blocked, as the PMOS 502 is switched off. In this case, the pull-down circuit 410 pulls the output 320 down to a logical zero value (row 3).

For the case, when the test signal 412 and the clock signal 318 are both one (rows 4 and 8 of table 2), the control signal 312, which is the inverted clock signal 414, becomes zero. This switches off the NMOS transistor 506, thereby gating the enable signal 404 from entering the latch 406. Further, the pull-down circuit 410 is disabled as the inverted clock signal 414 is zero and the latch 406 drives the output.

Figure 6:
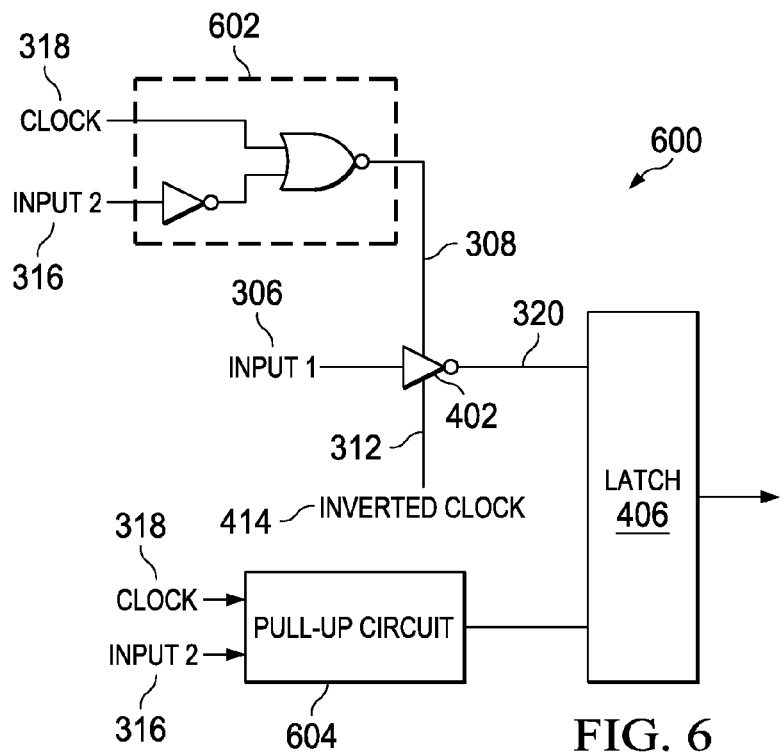
FIG. 6 is a block diagram of an exemplary NAND input latch.

In another embodiment, a NAND gate can provide an input to the latch 406. FIG. 6 illustrates a block diagram of an exemplary NAND input latch 600 that follows this embodiment. The NAND input latch 600 includes the tri-state inverter 402 and the latch 406. The tri-state inverter 402 receives the input signal 306 and provides the output signal 320 to the latch 406. A NOR combinational logic circuit 602 performs a NOR operation on the clock signal 318 and the input signal 316. Further, a pull-up circuit 604 is coupled to the latch 406 and it forces a logic one on the latch 406 in situations when the output 320 of the tri-state inverter 402 is disabled.

Figure 7:
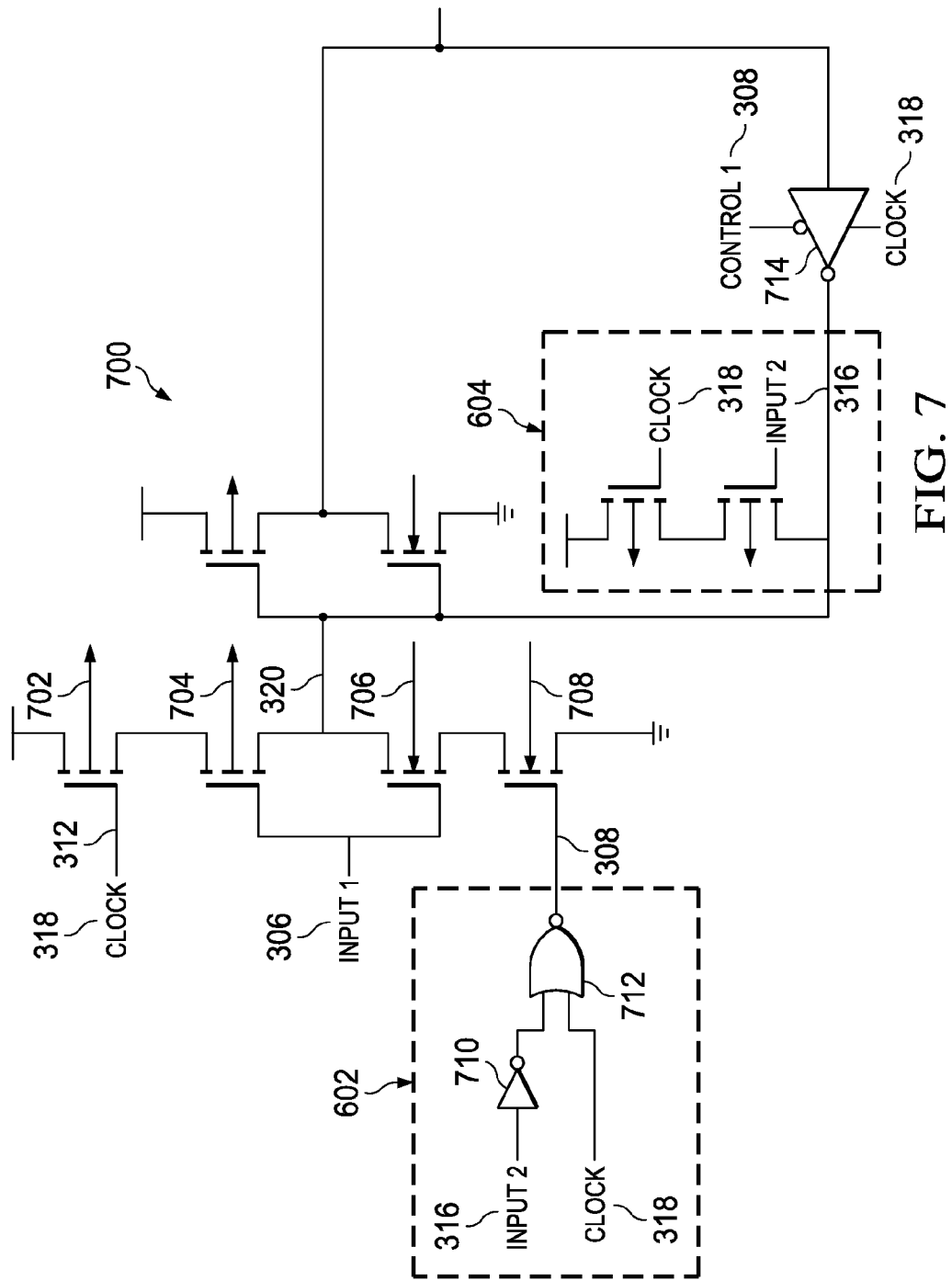
FIG. 7 is a circuit diagram of an exemplary NAND input latch.

FIG. 7 illustrates an exemplary circuit diagram 700 of the NAND input latch 600. Four transistors 702, 704, 706, and 708 form the tri-state inverter 402. The transistors can be any known transistors such as CMOS transistors, TTL transistors, and so on. In this diagram, the transistors are depicted as CMOS transistors. The transistors 702 and 704 are PMOS, while the transistors 706 and 708 are NMOS transistors. The control signal 308 is provided to the NMOS transistor 708, while the clock signal 318 (which is the control signal 312) is provided to the PMOS transistor 702.

The NOR combinational logic circuit 602 can be realised using an inverter 710 and a NOR gate 712. The inverter 710 inverts the input signal 316, and the output of the inverter 710 along with the clock signal 318 is provided to the NOR gate 712. A NOR operation is performed on the two signals, and the output of the NOR gate is the control signal 308. The control signal 308 along with the clock signal 318 control the gating of the tri-state inverter 402 and a second tri-state inverter (tri-state inverter 714), present in the latch 406. In addition, the pull-up circuit 604, which is coupled to the latch 406, includes two PMOS transistors that are controlled by the input signal 316 and the clock signal 318. Since the transistors are P-type, both signals should have a logic zero value to enable the pull-up circuit 604. It will be understood that an NMOS pull-up circuit can also be utilized, in which case, the input signals can be inverted before they are provided to the pull-up circuit 604.

The operation of the NAND input latch 600 will be described now with reference to FIGS. 6 and 7. Table 3 depicts the truth table for a NAND operation, while table 4 depicts the operation of the exemplary NAND input latch.

TABLE 3

Truth table for NAND

| Input 316 | Input 306 | Output 320 |
|---|---|---|
| 0 | 0 | 1 |
| 0 | 1 | 1 |
| 1 | 0 | 1 |
| 1 | 1 | 0 |

TABLE 4 operation of the exemplary NAND input latch

| Input 306 | Input 316 | Clock 318 | Control 312 | Control 308 | Output 320 |
|---|---|---|---|---|---|
| 0 | 0 | 0 | 0 | 0 | 1 (pull up, both) |
| 0 | 0 | 1 | 1 | 0 | Unchanged |
| 0 | 1 | 0 | 0 | 1 | 1 |
| 0 | 1 | 1 | 1 | 0 | Unchanged |
| 1 | 0 | 0 | 0 | 0 | 1 (pull up) |
| 1 | 0 | 1 | 1 | 0 | Unchanged |
| 1 | 1 | 0 | 0 | 1 | 0 |
| 1 | 1 | 1 | 1 | 0 | Unchanged |

Table 4 depicts the NAND function obtained between the input signals 306 and 316 for high and low clock values. It should be noted that only when the clock signal 318 is low, the latch value is allowed to change, while, for high clock values the output of the latch 406 remains unchanged (rows 2, 4, 6, and 8 of table 2) and the pull-up circuit 604 is not activated as clock signal 318 is one. In this case, the latch 406 drives the stored value.

According to table 4, whenever the input signal 316 is high and the clock 318 is low (rows 3 and 7 of table 4) the output 320 is an inversion of the input signal 306. In this case, the control signal 308 is high and it connects the NMOS transistor 706 to the ground. Further, as the clock signal 318 controls the PMOS 702, the low value of the clock signal 318 enables the PMOS 702 and connects it to the power supply. Therefore, when the clock signal 318 is low and the input signal 316 is high, both the PMOS and NMOS transistors 702 and 708 are switched on and the tri-state inverter 402 inverts the input signal 306 normally.

Alternately, whenever the input signal 316 is zero and the clock 318 is low (rows 1 and 5 of table 4), the output 320 is one, irrespective of the input signal 306. As the control signal 308 is low, the NMOS transistor 708 is disconnected, but the PMOS 702 is switched on (low clock signal 318). In this case, the pull-up circuit 604 is activated and it pulls the latch 406 value up regardless of the input signal 306 value. Note that if the input signal 306 is low (row 1), the pull-up path in the tri-state inverter 402 is also enabled, as clock signal 318 is low, however this does not cause any problem, because both, this pull up of the tri-state inverter 402 and the pull-up circuit 604 are trying to drive the output 320 high.

The latch 406 behaves transparently and forwards the input to the output when the clock signal 318 is low, as the tri-state inverter 716 is disabled. Alternately, when the clock signal 318 is high, the tri-state inverter 716 is enabled and the latch 406 behaves opaquely and forwards the last stored value.

In this manner, the exemplary NAND input latch 600 of FIGS. 6-7 performs the same operation as a NAND gate placed before a latch and provides a lower setup time for the input signal 306 as no series stack of transistors is present. Moreover, the sizing of the transistors in the NAND input latch 600 can be done independently to improve the performance.

In another embodiment, the functional-input sequential circuit 300 can be used for a functional flip-flop, such as a synchronous reset flip-flop, which can be created using a D flip-flop. In typical D flip-flops, a data signal is provided to an inverter at the input of the flip-flop. Replacing the inverter with a dual-input NAND gate can convert the flip-flop into a synchronous-reset flip-flop. One input of the NAND gate can be a data input, while the second input can be an active low clear/reset signal. However, replacing the inverter at the D flip-flop input with a NAND gate degrades the setup time for the data signal as the NAND gate includes a double NMOS series stack.

Figure 8:
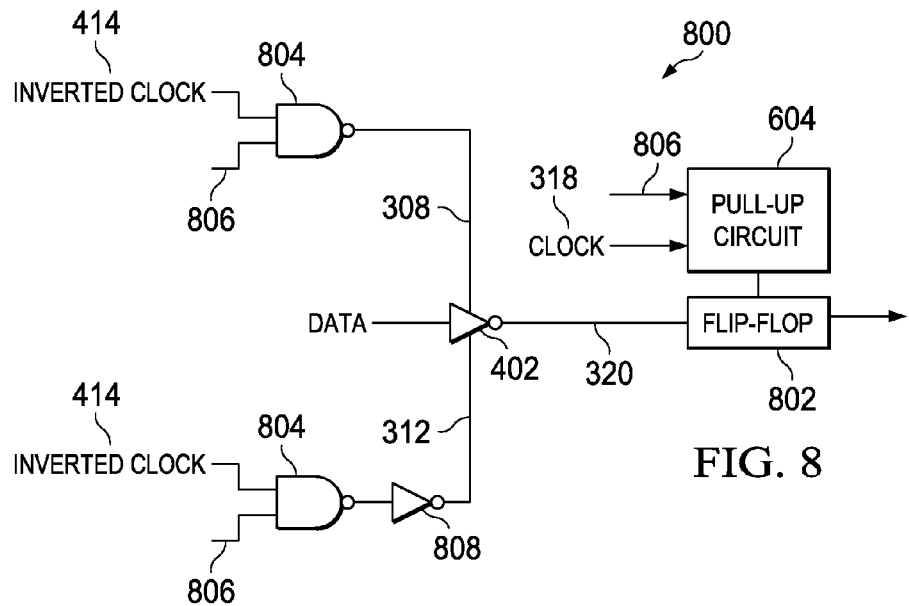
FIG. 8 is a block diagram of an exemplary NAND input flip-flop.

The functional-input sequential circuit 300 can replace the NAND gate flip-flop to improve the performance of the synchronous reset/clear flip-flop. FIG. 8 illustrates a block diagram of an exemplary NAND input Flip-flop 800, including the tri-state inverter 402, a flip-flop 802 coupled to the tri-state inverter 402, the pull-up circuit 604 coupled to the flip-flop 802, and a NAND combinational logic circuit 804 driving the tri-state inverter 402. The clock signal 318 and an active low clear signal 806 drive the pull-up circuit 604. The NAND combinational logic circuit 804 performs a logical NAND operation on an active low clear signal 806 and the inverted clock signal 414, producing the control signal 308. Further, the control signal 312 can be derived by inverting the control signal 308 at inverter 808.

In an alternate implementation, an inverter followed by a transmission gate can replace the tri-state inverter 402. This in case, the control signals 308 and 312 control the transmission gate. In this example, the input signals are the active low clear signal 806 and a data signal. It will be appreciated that this is merely exemplary and any other input signals can be utilized, such as set signals, reset signals, enable signal, and scan signals.

Figure 9:
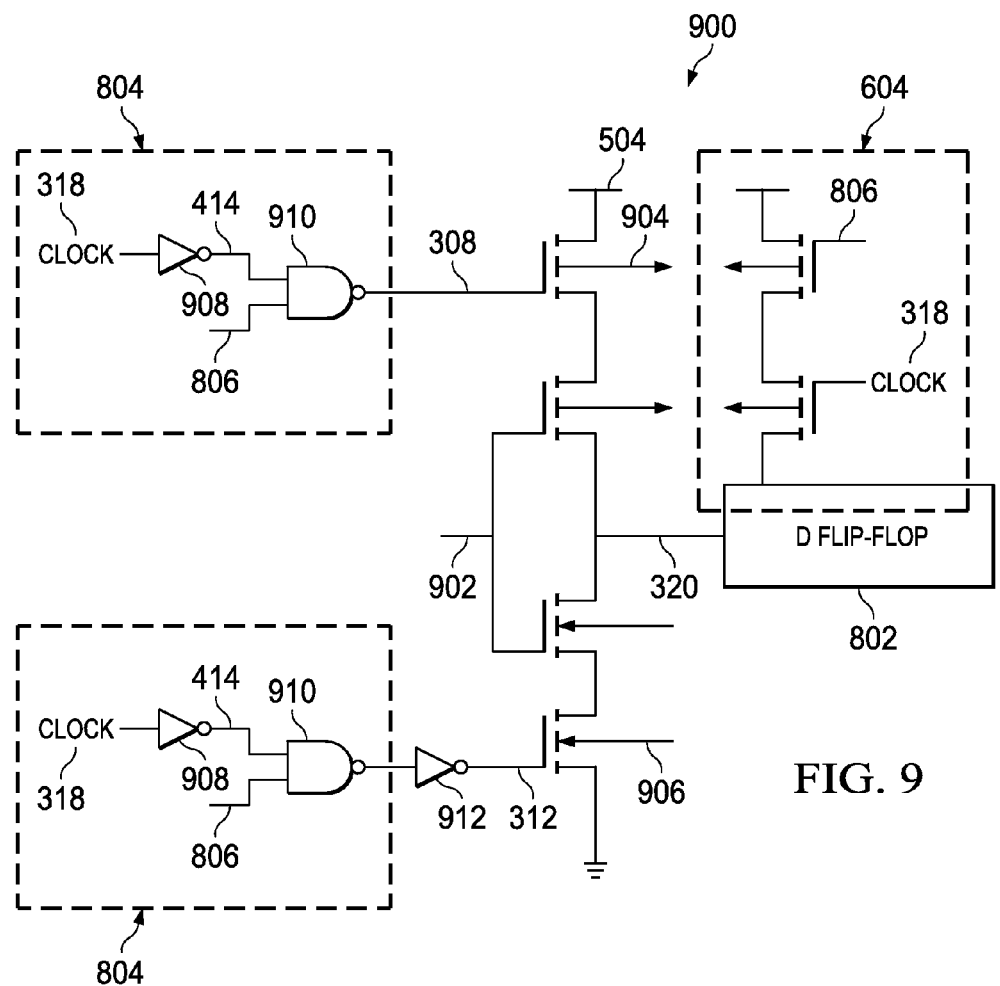
FIG. 9 is a circuit diagram of an exemplary NAND input flip-flop.

FIG. 9 illustrates the circuit diagram 900 of the exemplary NAND input flip-flop 800 diagrammed in FIG. 8. The tri-state inverter 402 receives an input signal, which can be the data signal 902. In addition, the tri-state inverter 402 receives two control signals, i.e., a first and second control signals. The control signal 308 is the output of the NAND combinational logic circuit 804. The control signal 312 is nothing but an inversion of the control signal 308. The control signal 308 is supplied to an active low switch, such as a PMOS transistor 904 that connects the data signal 902 to the power supply, while the control signal 312 controls an active high switch, such as an NMOS transistor 906 that connects the data signal 902 to the ground.

The flip-flop 802, which is a conventional master-slave delay (D) flip-flop, receives the output 320 of the tri-state inverter 402. It will be appreciated that any other type of flip-flop can be utilized, and the D flip-flop used here is merely to illustrate the operation of the NAND input flip-flop 800. Additionally, the pull-up circuit 604 is coupled to the flip-flop 802, and the active low clear signal 806 together with the clock signal 318 control the pull-up circuit 604. If both the signals are low, the pull-up circuit 604 forces the flip-flop 802 value high.

In one embodiment, the NAND combinational logic circuit 804 includes an inverter 908 and a NAND gate 910. The inverter 908 inverts the clock signal 318 and the inverted clock signal 414 is provided to the NAND gate 910 along with the active low clear signal 806. The output of the NAND gate 910 (control signal 308) is provided to the PMOS transistor 904. Further, an inverter 912 inverts the output of the NAND gate 910 and the inverted output, which is the control signal 312 is provided to the NMOS transistor 906.

The operation of the NAND input flip-flop 800 will now be described with reference to FIG. 8 and FIG. 9. Table 5 depicts a typical NAND truth table, while table 6 depicts the operation of the exemplary NAND input flip-flop 800.

TABLE 5

Truth table for NAND

| CLRZ 806 | Data 902 | Output 320 |
|---|---|---|
| 0 | 0 | 1 |
| 0 | 1 | 1 |
| 1 | 0 | 1 |
| 1 | 1 | 0 |

TABLE 6 operation of the exemplary NAND input flip-flop

| CLRZ 806 | Data 902 | Clock 318 | Control 308 | Control 312 | Output 320 |
|---|---|---|---|---|---|
| 0 | 0 | 0 | 1 | 0 | 1 (pull-up) |
| 0 | 0 | 1 | 1 | 0 | Unchanged |
| 0 | 1 | 0 | 1 | 0 | 1 (pull-up, both) |
| 0 | 1 | 1 | 1 | 0 | Unchanged |
| 1 | 0 | 0 | 0 | 1 | 1 |
| 1 | 0 | 1 | 1 | 0 | Unchanged |
| 1 | 1 | 0 | 0 | 1 | 0 |
| 1 | 1 | 1 | 1 | 0 | Unchanged |

As depicted in table 6, when the active low clear signal 806 is one, the output 320 follows the inverted data signal 902, however when the active low clear signal 806 is low, the output 320 is one irrespective of the data signal 902. In order to achieve this output 320, the control signals 308 and 312 gate the tri-state inverter 402.

As depicted in Table 6 and FIG. 9, when the clock signal 318 is low, and the clear signal 806 is one (rows 5 and 7 of table 6), the PMOS transistor 904 and the NMOS transistor 906 connect the tri-state inverter 402 to the power supply and the ground (as the control signal 308 is zero and the control signal 312 is one). In this situation, the tri-state inverter 402 operates normally, i.e., it inverts the data signal 902 and provides the inverted signal to the flip-flop 802 at the master latch input. Further, when the clock signal 318 is low, the master latch opens (and it accepts the input from the tri-state inverter 402), while the slave latch is closed, and the slave latch drives the output.

When clock signal 318 is high (rows 2, 4, 6, and 8 of the table 6), the PMOS transistor 904 and the NMOS transistor 906 disconnect the tri-state inverter 402 from the power supply and the ground, thereby disabling the tri-state inverter 402. The master latch of the flip-flop 802 closes and drives the output, while the slave latch opens.

Alternately, when the clear signal 806 is low and the clock signal 318 is low (rows 1 and 3 of table 6), the tri-state inverter 402 is gated as the first control signal is one and the second control signal is zero. Nevertheless, since the clock signal 318 is low, the master latch becomes active. Further, the low clock signal enables the pull-up circuit 604, which forces the value of the master latch high. When the clock signal 318 makes a transition from low to high, the master latch closes and the slave latch opens, clearing the output. However, when the clock signal 318 makes a transition from high to low, the pull-up circuit 604 forces the value of the master latch high, the master latch opens and the slave latch closes. This scenario ensures that the output of the flip-flop 802 remains unchanged. Therefore, the combination of the tri-state inverter, the NAND combinational logic circuit 804, and the pull-up circuit 604 provide the same result as a NAND gate, however, the set-up time for the data signal 902 is substantially reduced, because the series stacking of transistors is avoided. This is because the active low clear signal 806 has been removed from the critical path and placed in the NAND combinational logic circuit 804, reducing the set-up time for the data signal 902.

Figure 10:
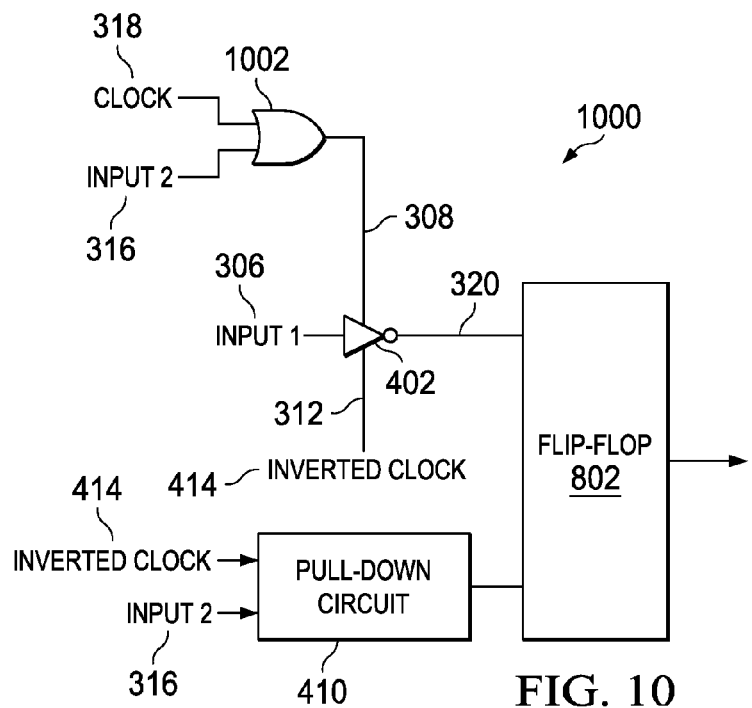
FIG. 10 is a block diagram of an exemplary NOR input flip-flop.

FIG. 10 depicts an alternate embodiment of the functional flip-flop. The block diagram depicts a NOR input flip-flop 1000, it includes the tri-state inverter 402 that receives the input signal 306, the flip-flop 802 connected to the output of the tri-state inverter 402, the pull-down circuit 410 coupled to the flip-flop 802, and an OR combinational logic circuit 1002 controlling the gating logic of the tri-state inverter 402. The OR combinational logic circuit 1002 performs a logical OR operation on the input signal 316 and the clock signal 318. The output of the OR combinational logic circuit 1002 (control signal 308) and the inverted clock signal 414 (control signal 312) control the tri-state inverter 402. Further, the pull-down circuit 410 that forces the master latch of the flip-flop 802 to zero logic is controlled by the input signal 316 and the inverted clock signal 414. A high input signal 316 and a low clock signal 318 enable the pull-down circuit 410.

The operation of the NOR input flip-flop 1000 is similar to the operation of the NOR input latch 400. Further, any input signals can be applied to the NOR input flip-flop 1000. For example, a data signal 902 can be the input signal 306, while a reset, set, scan, or a second data signal can be the input signal 316. In another embodiment, the NOR input flip-flop 1000 can function for more than two inputs. A first input can be supplied to the tri-state inverter 402, while the other inputs can be supplied to the combinational logic circuit 310.

Exemplary Method

Figure 11:
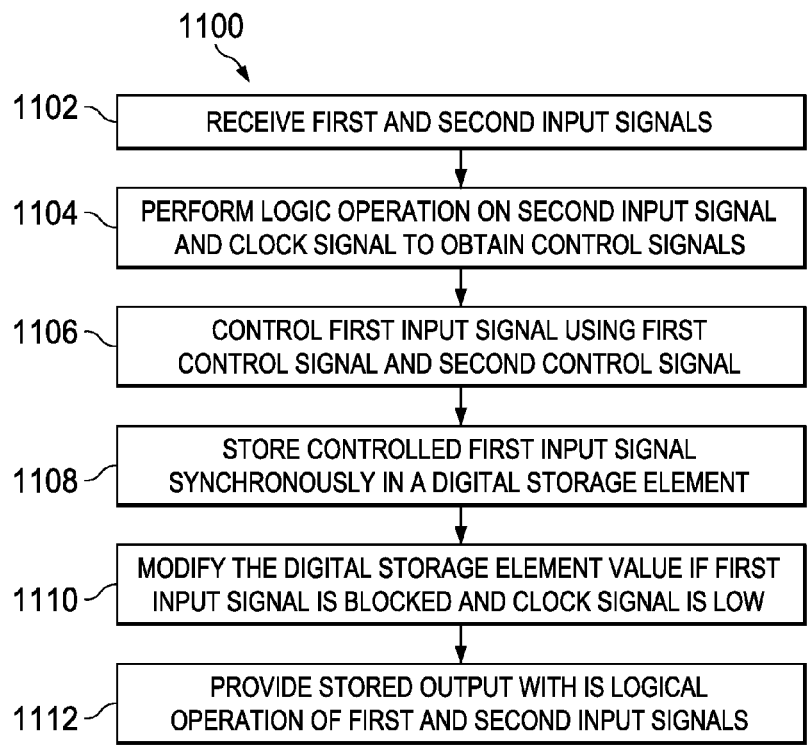
FIG. 11 depicts a flowchart for performing a logical operation on input signals of a sequential circuit.

FIG. 11 is a flowchart of a method 1100 for performing a logical function on at least one input signal in a functional-input sequential circuit. The method 1100 will be described with reference to components shown in FIGS. 3-10 and the accompanying description, above. The method 1100 includes steps directed towards performing a logical function such as an OR, NOR, AND, or NAND operation.

At step 1102, a first input signal and a second input signal are received. In one implementation, the first input signal 306 is provided to a transmission circuit, such as the transmission circuit 302. Examples of transmission circuits include, but are not limited to, tri-state inverters, inverters followed by transmission gates, buffers followed by transmission gates, and switches. A combinational logic circuit, such as the combinational logic circuit 310 receives the second input signal 316. In one embodiment, the input signal 306 or the input signal 316 can include more than one signal. Examples of first and second input signals include, but are not limited to, data signals, test signals, enable signals, scan signals, set signals and reset signals. Further, in another embodiment, one of the first or second input signals can be a non-critical signal.

A combinational logic operation is performed on the input signal 316 and a clock signal 318 at step 1104 to obtain a control signal. In one embodiment, the combinational logic circuit 310 performs the logical operation. The particular combinational logic operation performed will be dictated by the requirements of the application in question. For example, for a NOR-input sequential circuit the combinational logic circuit 310 performs a logical OR operation. Examples of other combinational logic operations can include any combinations of NAND, NOR, AND, OR, and NOT operations. The output of the combinational logic circuit 310 is the control signal 308.

At step 1106, the first input signal 306 is controlled by the first control signal 308 and a second control signal. In one implementation, the second control signal 312 can be employed to control the first input signal 306. The control signal 312 can vary depending on the application in questions. For example, the control signal 312 can be the clock signal 318, the inverted clock signal 414, and the inverted control signal 308. In one embodiment, the control signals 308 and 312 are provided to the transmission circuit 302. Based on the values of the control signals 308 and 312 the transmission circuit 302 can either pass the input signal 306 or block it. In embodiment, where the transmission circuit 302 is a tri-state inverter 402 or an inverter followed by transmission gates, the first input signal 306 is inverted and the inverted input signal 306 is provided as the output 320 of the tri-state inverter 402.

At step 1108, the output 320 is received and stored in a digital storage element, such as the digital storage element 304. The digital storage element 304 can be a latch or a flip-flop. The input signals that are allowed to pass at the transmission circuit 302 reach the digital storage element 304. The digital storage element 304 stores the output signal 320 for a clock period. In case the clock signal 318 is low, the digital storage element 304 behaves transparently and forwards the signal at its input to the output. If the clock signal 318 is high, the digital storage element 304 stores the output 320 until the clock signal 318 becomes low.

In cases when the input signal 306 is blocked and when the clock signal 318 is low, the value of the digital storage element 304 is controlled at step 1110. In one embodiment, a control circuit 314, such as a pull-up or a pull-down circuit is employed to control the digital storage element value. In case of a pull-down circuit, such as the pull-down circuit 410, the digital storage element 304 value is pulled down to a logic zero, while in case of a pull-up circuit, such as the pull-up circuit 604, the digital storage element 304 value is pulled up to a logic one. The control circuit 314 controls the value of the digital storage element 304 depending on the value of the input signal 306, the input signal 316, and the clock signal 318.

The output of the digital storage element is obtained at step 1112. This output is a logical function of the input signals 306 and 316. Therefore, the logical function at the input of a sequential circuit is carried out by separating the two input signals, providing one input signal 306 to a transmission circuit 302 and using the second input signal 316 to obtain a control signal 308 that controls the operation of the transmission circuit 302. Further, the control circuit 314 helps realize the logical function. For example, instead of employing a NOR gate for a NOR operation, a transmission gate, a combinational logic circuit, and a control circuit are used to obtain the same functionality as a NOR gate. However, the set-up time of the input signal is substantially reduced, as the series-stacking present in a typical NOR gate has been removed, and the input path includes a single signal.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A functional-input sequential circuit comprising:
   a transmission circuit, receiving a first input signal, a first control signal, and a second control signal, the first and second control signals controlling an output of the transmission circuit;
   a combinational logic circuit performing a logical function on a second input signal and a clock signal to provide the first control signal, the combinational logic circuit being coupled to the transmission circuit;
   a digital storage element receiving the output signal from the transmission circuit; and
   a control circuit operatively coupled to the digital storage element, the control circuit forcing a value on the digital storage element depending on values of the first input signal, the second input signal, and the clock signal.

2. The functional-input sequential circuit of claim 1, wherein the transmission circuit is at least one of a tri-state inverter, a tri-state buffer, a switch, an inverter followed by a transmission gate, and a buffer followed by a transmission gate.

3. The functional-input sequential circuit of claim 1, wherein an output of the functional sequential circuit is at least one of a logical OR operation, a logical NOR operation, a logical AND operation, and a logical NAND operation of the first input signal and the second input signal.

4. The functional-input sequential circuit of claim 1, wherein the combinational logic circuit performs at least one of a logical OR operation, a logical AND operation, a logical NOR operation, and a logical NAND operation on at least one second input signal and the clock signal.

5. The functional-input sequential circuit of claim 1, wherein the second control signal includes at least one of the clock signal, inverted clock signal, or an inverted first control signal.

6. The functional-input sequential circuit of claim 1, wherein the control circuit includes at least one of a pull-up circuit or a pull-down circuit.

7. The functional-input sequential circuit of claim 1, wherein at least one of the first input signal and the second input signal includes a critical signal.

8. The functional-input sequential circuit of claim 1, wherein the digital storage element is at least one of a flip-flop and a latch.

9. The functional-input sequential circuit of claim 1, wherein the functional-input sequential circuit is at least one of a NOR-input latch and a flip-flop, wherein:
the transmission circuit includes a tri-state inverter;
the combinational logic circuit includes an OR circuit;
the digital storage element is at least one of a latch and a flip-flop; and
the control circuit includes a pull-down circuit, forcing a digital zero on the latch.

10. The functional-input sequential circuit of claim 1, wherein the functional-input sequential circuit includes at least one of a NAND-input latch and flip-flop, wherein:
the transmission circuit includes a tri-state inverter;
the combinational logic circuit includes a NOR circuit;
the digital storage element includes at least one of a latch and flip-flop; and
the control circuit includes a pull-up circuit, forcing a digital one on the latch.

11. The functional-input sequential circuit of claim 1, wherein the functional-input sequential circuit includes at least one of a NOR-input latch and a flip-flop, wherein:
the transmission circuit includes a tri-state inverter;
the combinational logic circuit includes an OR circuit;
the digital storage element includes at least one of a latch and a flip-flop; and
the control circuit includes a pull-down circuit, forcing a digital zero on the flip-flop.

12. The functional-input sequential circuit of claim 1, wherein the functional-input sequential circuit includes at least one of a NAND-input latch and a flip-flop, wherein:
the transmission circuit includes a tri-state inverter;
the combinational logic circuit includes a NAND circuit;
the digital storage element includes a latch or flip-flop; and
the control circuit includes a pull-up circuit, forcing a digital one on the flip-flop.

13. A functional-input sequential circuit for reducing the setup time of a critical input signal comprising:
a transmission circuit for producing an output signal in response to the critical input signal, a first control signal, and a second control signal;
a combinational logic circuit for producing the first control signal in response to a non-critical input signal and a clock signal;
a digital storage element for providing an output corresponding to a functional operation of the critical input signal and the non-critical input signal in response to the output signal, the digital storage being operatively coupled to the output of the transmission circuit; and
a control circuit coupled to the digital storage means for forcing a digital value on the digital storage in response to the non-critical input signal and the clock signal.

14. The functional-input sequential circuit of claim 13, wherein the functional-input includes at least one of an AND input, an OR input, a NOR input, or a NAND input.

15. The functional-input sequential circuit of claim 13, wherein the output of the digital storage means includes at least one of AND operation, OR operation, NOR operation, or NAND operation on the critical input signal and the non-critical input signal.

16. A method comprising the steps of:
receiving a first input signal and a second input signal;
performing a combinational logic operation on the second input signal and a clock signal to generate a first control signal;
controlling the first input signal using the first control signal and a second control signal;
storing a controlled first input signal at a digital memory device;
controlling the value of the memory device depending on the state of the second input signal and the clock signal; and
providing the stored signal which is a logical function of the first and the second input signals.

17. The method of claim 16 further includes generating the second control signal by inverting the clock signal.

18. The method of claim 16 further includes generating the second control signal by inverting the first control signal.

19. The method of claim 16 wherein the second control signal includes the clock signal.

20. The method of claim 16, wherein at least one of the first input signal and the second input signal includes a critical signal.

* * * * *